United States Patent [19]
Nowak et al.

[11] Patent Number: 5,878,094
[45] Date of Patent: Mar. 2, 1999

[54] NOISE DETECTION AND DELAY RECEIVER SYSTEM

[75] Inventors: Edward J. Nowak, Essex Junction; Dale E. Pontius, Colchester; Michael A. Roberge, Milton; Minh H. Tong, Essex Junction, all of Vt.

[73] Assignee: International Business Machines Corporation, Armonk, N.Y.

[21] Appl. No.: 879,486

[22] Filed: Jun. 10, 1997

[51] Int. Cl.[6] .......................... H03K 5/1252; H04B 1/10
[52] U.S. Cl. .......................... 375/349; 329/311; 326/21; 327/206; 327/551
[58] Field of Search .................... 375/257, 285, 375/316, 340, 346, 349; 455/132, 254, 295, 296, 303, 312; 329/311; 327/18, 74–76, 199, 205, 206, 208, 223, 309, 310, 551; 326/21–24, 35, 36

[56] References Cited

U.S. PATENT DOCUMENTS

| | | |
|---|---|---|
| 4,156,202 | 5/1979 | Takahashi .......................... 327/310 |
| 4,460,871 | 7/1984 | Orban ................................ 327/309 |
| 4,959,562 | 9/1990 | Ootani .............................. 326/24 |
| 4,965,474 | 10/1990 | Childers et al. .................. 327/180 |
| 4,965,800 | 10/1990 | Farnbach .......................... 371/22.1 |
| 5,315,173 | 5/1994 | Lee et al. ......................... 326/21 |
| 5,341,033 | 8/1994 | Koker ............................... 327/206 |
| 5,418,486 | 5/1995 | Callahan ........................... 327/310 |
| 5,475,320 | 12/1995 | Ko .................................... 326/21 |
| 5,594,379 | 1/1997 | Kiraly ............................... 327/381 |

Primary Examiner—Stephen Chin
Assistant Examiner—Jeffrey W. Gluck
Attorney, Agent, or Firm—DeLio & Peterson, LLC; Peter W. Peterson; Robert A. Walsh

[57] ABSTRACT

A noise detection and delay receiver circuit includes a circuit input and output and a plurality of individual receiver circuits connected to the input having trip points which range from a low trip point to a high trip point. Edge detect circuitry and delay circuitry are used to prevent the output from changing back to the previous state for a period of time immediately after it has just changed state. Multiple transitions of the input voltage across the trip points of the individual receivers are used to delay the response until noise has settled out of the input signal.

15 Claims, 1 Drawing Sheet

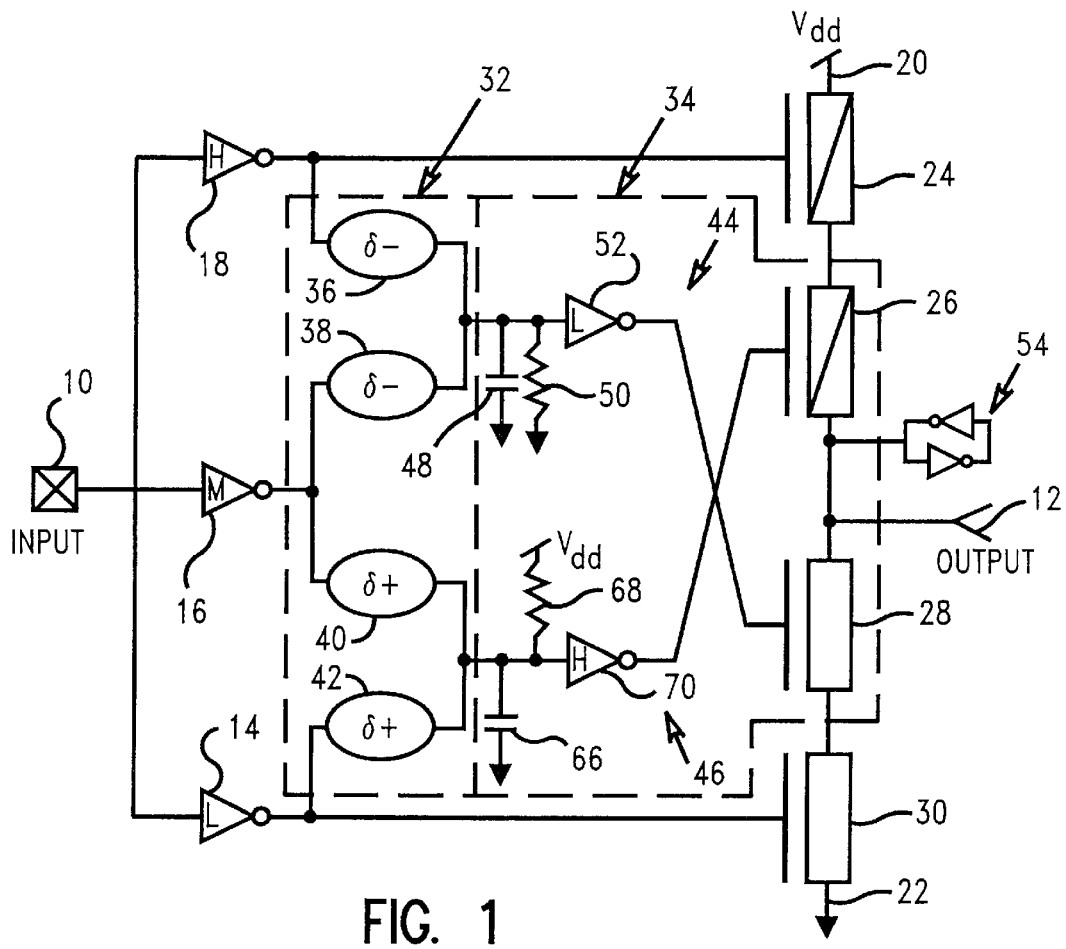
FIG. 1
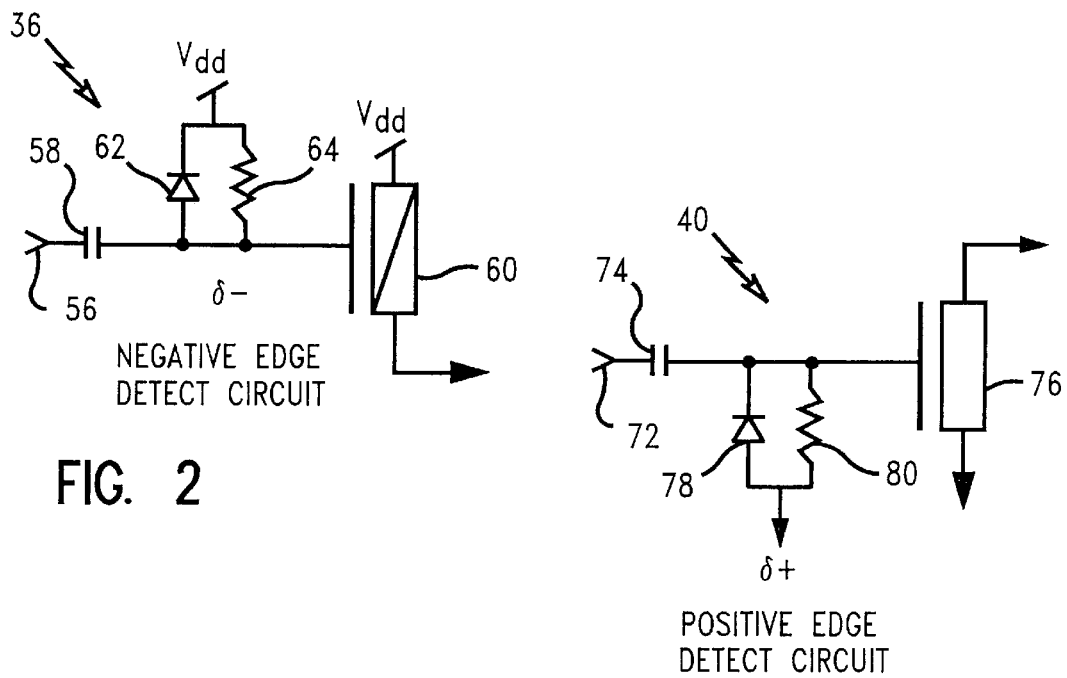
FIG. 2
FIG. 3

NOISE DETECTION AND DELAY RECEIVER SYSTEM

BACKGROUND OF THE INVENTION

1. Field of the Invention

The present invention generally relates to digital receivers used at the input of a digital device to detect a digital signal and transmit it without error to the device. More specifically, the present invention relates to the design of digital receivers that may be used to receive noisy digital input signals.

2. Description of Related Art

Digital receivers are used at the input of digital devices, such as digital devices connected to a digital network. The receiver's function is to detect when a digital input signal is high or low, corresponding to digital ones and zeros, and pass that signal through to the digital device. It is of prime importance that the receiver accurately transmit the input signal, without error, and without introducing additional false digital data. This can be difficult when the digital input signal is noisy.

For use in high speed systems, it is desirable for the receiver to have the fastest possible response. However, receiver accuracy cannot be sacrificed to achieve higher speeds. When the digital input signal is guaranteed to be "clean", i.e., where the signal has little or no noise associated with it, the receiver can be designed to be very fast. Real world digital signals, on the other hand, often have a great deal of noise, particularly at the transitions between each low and high. In the presence of such noise, a high speed receiver may not accurately track the input signal as the noise at the transitions between each bit falsely switches the receiver.

The conventional solution to this problem is simply to slow down the receiver sufficiently that it does not respond the rapid voltage swings of noisy and poorly switched digital signals. This type of receiver design makes the devices that produce clean digital signals pay the penalty of slow receiver speed necessary to accommodate devices that do not produce clean signals.

Bearing in mind the problems and deficiencies of the prior art, it is therefore an object of the present invention to provide a digital receiver that has a rapid response in the presence of clean, noise free, digital input signals and which has a slower delayed response in the presence of noisy signals.

Yet another object of the present invention is to provide a method of reducing the noise sensitivity of a receiver by varying the delay of the receiver according to the noise in the input signal.

Still other objects and advantages of the invention will in part be obvious and will in part be apparent from the specification.

SUMMARY OF THE INVENTION

The above and other objects, which will be apparent to those skilled in the art, are achieved in the present invention which is directed to a noise detection and delay receiver circuit which detects when a digital signal is noisy and delays the output until the signal quiets down, thus avoiding the output of an erroneous logic level.

The receiver circuit of the invention includes at least two, and preferably three or more independent receiver circuits connected to the circuit input, each receiver circuit having a different trip point that varies from low to high. As a clean digital signal changes from a low voltage to a high voltage or vice-a-versa, these receivers switch state sequentially. The receiver circuits are coupled to edge detector circuits that are in turn connected to delay circuits. The edge detector circuits and the multiple receiver circuits are connected together in a way that allows voltage fluctuations at the circuit input due to noise to be differentiated from voltage fluctuations at the circuit input due to actual digital signals.

The receiver switching at the lowest trip point is directly connected to the circuit output and generally controls the switching of the circuit output from high to low. This receiver causes a rapid change of state at the circuit output from high to low when it sees a high to low transition across its own trip point, unless this change of state at the circuit output is delayed by other receivers.

When the low trip point receiver detects such a high to low transition across its trip point, it automatically delays the reverse change of state at the circuit output (from low back to high) for a predetermined delay period. This delay is implemented through the edge detector and delay circuits.

The high trip point receiver works in the mirror image manner and controls the switching from low to high. It causes a rapid change of the circuit output from low to high when it sees a low to high transition at the circuit input across its trip point, unless this output change is delayed by the low trip point or other receiver. Like the low trip point receiver, it delays the reverse change of the circuit output (from high to low) for a period of time after it has changed the output from low to high.

In effect, the initial state change at the circuit output (from low to high or high to low) is always fast, but a subsequent state change cannot occur for a delay time after the previous change. Further, multiple rapid voltage swings at the circuit input across the trip points of the multiple receivers extend the delay that prevents the output from switching. In this way, the output is held while the digital signal at the input settles down.

Noise in the digital signal at the input is detected by the transitions of the input signal across the voltage trip points of the individual receivers in the circuit. In the preferred embodiment of the invention there is a mid trip point receiver that delays switching of the output whenever the input signal transitions across its trip point. Multiple transitions across its trip point cause longer delays, whereas a single transition, such as occurs on even a clean digital signal, produces a very short delay adjusted to provide the desired circuit speed for clean digital signals.

More specifically, the invention includes a circuit input for receiving a digital input signal, a circuit output for outputting a digital output signal, a high trip point receiver circuit connected to the circuit input, the high trip point receiver circuit providing a digital high to the circuit output for the digital output signal when the digital input signal has a voltage above a defined high trip point voltage, and a low trip point receiver circuit connected to the circuit input, the low trip point receiver circuit providing a digital low to the circuit output for the digital output signal when the digital input signal has a voltage below a defined low trip point voltage.

A negative edge detect circuit is connected to the high trip point receiver circuit, and a positive edge detect circuit is connected to the low trip point receiver circuit. A delay circuit is connected to the positive and negative edge detect circuits and is positioned between the circuit output and the high and low trip point receiver circuits for delaying the digital output signal in the presence of noise in the digital input signal.

In the preferred design, the noise detection and delay receiver circuit also includes a mid trip point receiver circuit connected to the circuit input. The mid trip point receiver circuit has a trip point voltage between the high and low trip point voltages. It also has associated edge detect circuitry connected between the mid trip point receiver circuit and the delay circuit.

The edge detect circuitry connected between the mid trip point receiver circuit and the delay circuit preferably includes a second positive edge detect circuit connected between the mid trip point receiver circuit, and the delay circuit, and a second negative edge detect circuit connected between the mid trip point receiver circuit and the delay circuit.

In the most highly preferred embodiment the noise detection and delay receiver circuit includes:

a circuit input for receiving a digital input signal;

a circuit output for outputting a digital output signal;

a high trip point receiver circuit connected to the circuit input, the high trip point receiver circuit providing a digital high to the circuit output for the digital output signal when the digital input signal has a voltage above a defined high trip point voltage;

a low trip point receiver circuit connected to the circuit input, the low trip point receiver circuit providing a digital low to the circuit output for the digital output signal when the digital input signal has a voltage below a defined low trip point voltage;

a mid trip point receiver circuit connected to the circuit input;

a first negative edge detect circuit connected to the high trip point receiver circuit;

second negative edge detect circuit connected to the mid trip point receiver circuit;

a first positive edge detect circuit connected to the low trip point receiver circuit;

a second positive edge detect circuit connected to the mid trip point receiver circuit;

a first transistor connected to a supply voltage and having a control lead connected to the high trip point receiver circuit;

a second transistor serially connected between the first transistor and the circuit output;

a third transistor serially connected between a fourth transistor and the circuit output;

the fourth transistor connected between the third transistor and ground, the fourth transistor having a control lead connected to the low trip point receiver circuit;

a delay circuit comprising:

a negative edge delay circuit responsively connected to the first and second negative edge detect circuits and including the third transistor, the third transistor being turned off by the negative edge delay circuit for a first delay time in the presence of noise detected by the negative edge detect circuits; and a positive edge delay circuit responsively connected to the first and second positive edge detect circuits and including the second transistor, the second transistor being turned off by the positive edge delay circuit for a second delay time in the presence of noise detected by the positive edge detect circuits.

The present invention also includes the method of reducing the noise sensitivity of a receiver circuit by connecting a plurality of individual receiver circuits to the circuit input, each receiver circuit having a different trip point ranging from a low trip point to a high trip point. Transitions of the digital input signal across the trip points of the plurality of individual receiver circuits are then detected with edge detect circuitry and changes of state at the circuit output are delayed when transitions across the trip points of the plurality of individual receiver circuits occur as the result of noise in the input signal.

BRIEF DESCRIPTION OF THE DRAWINGS

The features of the invention believed to be novel and the elements characteristic of the invention are set forth with particularity in the appended claims. The invention itself, both as to organization and method of operation, may best be understood by reference to the detailed description which follows taken in conjunction with the accompanying drawings in which:

FIG. 1 is a circuit diagram of the noise detection and delay receiver circuit of the present invention, the edge detect circuit portions of the circuit being shown in block diagram form.

FIG. 2 is a detailed circuit diagram of the negative edge detect circuit shown in block form in FIG. 1.

FIG. 3 is a detailed circuit diagram of the positive edge detect circuit shown in block form in FIG. 1.

DESCRIPTION OF THE PREFERRED EMBODIMENT(s)

In describing the preferred embodiment of the present invention, reference will be made herein to FIGS. 1–3 of the drawings in which like numerals refer to like features of the invention.

Referring to FIG. 1, the present invention includes a circuit input 10 and a circuit output 12. At the circuit input there are three individual receiver circuits 14, 16 and 18 having different voltage trip points which range from a low trip point for receiver 14 through a mid trip point for receiver 16 to a high trip point for receiver 18. These receiver circuits provide an inverted output and will switch their outputs from high to low when the voltage of a digital signal at the circuit input 10 rises from below their trip point to a voltage level above their trip point.

The circuit output 12 is connected to a supply voltage Vdd indicated with reference numeral 20 through first and second transistors 24 and 26. The circuit output is also connected to ground 22 via third and fourth transistors 28 and 30. In the preferred design, the first transistor 24 and the second transistor 26 are PFETs and the third and fourth transistors 28 and 30 are NFETs. Other types of switches and other types of transistors may also be used.

To switch the circuit output 12 high, transistors 24 and 26 must be turned on. To switch the circuit output 12 low, transistors 28 and 30 must be turned on. In the absence of noise at the circuit input, transistors 26 and 28 are normally on. Thus, switching of the output is normally controlled by transistors 24 and 30 which are controlled by the high trip point receiver 18 and the low trip point receiver 14, respectively. Due to the different trip points of these two receivers (14, 18), only one of these two transistors (24, 30) will be on at any one time. Except in the presence of noise when output delay is active, transistor 24 will be on and the circuit output high when the voltage at the circuit input 10 is above the high trip point of receiver 18, and transistor 30 will be on and the circuit output low when the voltage at the circuit input 10 is below the low trip point of receiver 14.

The outputs of the receivers 14, 16 and 18 are connected to edge detect circuitry, generally, indicated with the outline box marked with reference numeral 32. The edge detect circuitry determines when the circuit input is moving across the trip points of the associated receivers in a particular direction. This information is used to determine when the digital input signal is noisy and thus when to delay changes of state at the circuit output.

The edge detect circuitry 32 is connected to delay circuitry, generally indicated with the outline box marked with reference numeral 34. The delay circuitry 34 includes transistors 26 and 28 which are used to cripple the circuit output and prevent it from changing state when noise at the circuit input is detected by the edge detect circuitry 32.

The edge detect circuitry 32 may be further broken down into negative edge detect circuitry and positive edge detect circuitry. The negative edge detect circuitry is composed of two identical negative edge detect circuits 36 and 38 connected to the high and mid trip point receivers 18, 16 respectively. The positive edge detect circuitry is composed of two identical positive edge detect circuits 40 and 42 connected to the mid and low trip point receivers 16, 14 respectively.

The negative edge detect circuits 36 and 38 in FIG. 1 are shown as block diagrams. The detailed circuits are shown in FIG. 2. The positive edge detect circuits of block diagrams 40 and 42 are shown in FIG. 3.

The delay circuit 34 may also be broken down into separate delay circuits, namely, a negative edge delay circuit 44 and a positive edge delay circuit 46. The negative edge delay circuit 44 includes transistor 28 and the positive edge delay circuit 46 includes transistor 26.

The operation of the circuit can now be described in general. Initially, assume that the circuit is in steady state with a low voltage corresponding to a digital low presented at the circuit input 10. This low voltage will be below the trip points of receivers 14, 16 and 18. Accordingly, the outputs of all receivers, and particularly the output of receiver 14 will be high. Thus, NFET transistor 30 will be on, connecting the output to ground 22 and providing a digital low at the circuit output 12. In this state, the output of receiver 18 will also be high turning off PFET transistor 24 and disconnecting the output from supply voltage Vdd.

In this initial steady state, no edges will be detected by the edge detect circuitry 32 and the delay circuitry will not be introducing any delays. In this condition, transistors 26 and 28 will be on as described in greater detail below.

Now consider the transition from this low input state to the high input state. In sequence, the voltage at the circuit input will pass the trip points of receivers 14, 16 and 18. As the trip point of receiver 14 is exceeded, its output will switch from high to low. This is a negative edge and will produce no output from positive edge detect circuit 42. The low output from receiver 14 will turn off NFET transistor 30 to disconnect the output from ground 22. As the voltage increases, the trip point of receiver 16 and then the trip point of receiver 18 will be exceeded. As the trip point of receiver 16 is exceeded, the output of receiver 16 switches from high to low. This is a negative edge which is detected by negative edge detect circuit 38 and signaled to the negative edge delay circuit 44 which turns off transistor 28 for a delay time. Transistor 28, however, is in series with transistor 30 which has already been turned off and, accordingly, this has no effect on circuit operation. The negative edge due to the change at the output of receiver 16 is not detected by positive edge detect circuit 40 and, accordingly, no change occurs at transistor 26.

Ultimately, the input voltage at circuit input 10 exceeds the trip point of receiver 18 causing the output of receiver 18 to switch from high to low. This high to low transition turns on transistor 24 which connects the output to Vdd to produce a digital high at output 12. The high to low transition at the output of receiver 18 also is detected by negative edge detect circuit 36 which, like the detection by circuit 38, briefly signals a delay through the negative edge delay circuit 44 to turn off transistor 28.

On a clean digital signal, the digital input signal will remain above the trip point of receiver 18 for sufficiently long to allow the edge detect circuits and delay circuits to settle out and again turn on transistor 28. The circuit will now be in the steady state described previously, except that the input will be high and the circuits will be ready for a transition back to the low state. In this condition, transistors 24, 26 and 28 will be on and transistor 30 will be off. It should be noted that the switching time of the output 12 of the circuit is quite fast. This is because for transitions to the high state, the output of receiver 18 is directly connected to transistor 24 and for transitions to the low state, the output of receiver 14 is directly connected to transistor 30.

For clean digital signals these direct connections immediately change the state of the circuit output. However, consider the situation in which the input signal is not clean and immediately after rising above the trip point of receiver 18, the voltage at the input begins to fall. This type of rise and fall is typical of a noisy digital signal. If the voltage falls below the high trip point of receiver 18, transistor 24 will be turned off. Since transistor 30 is still off, this would leave the output 12 floating, if not for the presence of soft latch 54 which provides some hysteresis, and which will continue to hold the output high until the output is positively switched to the opposite state.

If the voltage continues to fall, it may ultimately fall below the low trip point of receiver 14. If the delay circuitry was not active, this would change the state of the output low; however, because only a very brief interval has passed since the immediately preceding rising edge at input 10, transistor 28 will still be turned off. Thus, even if the noisy input signal drops sufficiently to pass below the trip point of receiver 14, the output will not switch low even when transistor 30 turns on.

The time constants of the delays are chosen such that by the time transistor 28 turns on, the noise will have settled out and the signal at the input will have again risen back to the point where transistor 30 is off and transistor 24 is on.

Operation of the delay circuits 44 and 46 can now be described in greater detail. Consider again the starting steady state with a low input to the circuit. During the transition to the high state at the input, all of the receivers 14, 16 and 18 switch their outputs low as previously described. This high to low change is detected by the negative edge detect circuits 36 and 38 which produce pulses to the negative edge delay circuit 44.

As will be described in connection with FIG. 2, the negative edge detect circuits provide a pulse when they detect a negative edge. This pulse briefly charges capacitor 48 in negative edge delay circuit 44. Capacitor 48 will begin to discharge to ground through resistor 50, but during a delay time set by the RC time constant of this resistor capacitor combination, inverter 52, which has a relatively low trip point, will change state. During this change of state the output of inverter 52 will go low, turning off NFET transistor 28. While transistor 28 is off, the output is crippled and cannot be switched low by transistor 30 or receiver 14.

The negative edge delay circuitry composed of negative edge detect circuits 36 and 38 cripples the output through negative edge delay circuit 44 for a period of time set by the RC time constant of 48 and 50 and by the parameters of the negative edge detect circuits 36 and 38. This prevents the circuit output 12 from changing state back to low for a delay period after it is switched to the high output state.

To understand operation of the negative edge detect circuit 36 (and identical circuit 38), FIG. 2 should now be referred to. The negative edge detect circuit of FIG. 2 includes an input 56 connected through capacitor 58 to the gate of PFET transistor 60. The gate of transistor 60 is connected through diode 62 and resistor 64 to the supply voltage Vdd. When the input 56 to negative edge detect circuit 36 is high, capacitor 58 will be discharged through resistor 64. The gate of PFET 60 will also be high and the transistor 60 will be off.

When a falling (negative) edge arrives at input 56, diode 62 will become reverse biased. The gate of PFET 60 will briefly drop in voltage as current flows through resistor 64 and capacitor 58 begins to charge. This drop in voltage turns on transistor 60 for a period of time set by the RC time constant of resistor 64 and capacitor 58. After capacitor 58 is charged, the voltage at the gate of PFET transistor 60 will be high and the transistor will turn off. Thus, the circuit of FIG. 2, briefly signals the presence of a negative edge at its input.

With capacitor 58 charged, the reverse transition involving the change in state from low to high at input 56 will cause the gate of PFET transistor 60 to be clamped by diode 62 at a voltage equal to Vdd plus the forward voltage drop across diode 62. This increase in voltage at the gate of PFET transistor 60 will not turn on the transistor and there will be no significant output from the circuit. Thus positive edges are ignored by circuits 36 and 38.

If there are continuous multiple swings of the input voltage across the trip point of the associated receiver, these swings will pump the capacitor 58 and extend the on time of transistor 60. This extends the delay time until noise can settle out of the input signal.

The operation of the positive edge detect circuit as shown in FIG. 3 and the associated positive edge delay circuit 46 is similar. Referring to FIG. 1, the positive edge detect circuits 40 and 42 briefly produce a short negative going pulse at their outputs when positive edges are detected at their inputs. The positive edge delay circuit 46 is composed of capacitor 66 and resistor 68 connected to inverter 70 having a relatively high set point.

The output of high set point inverter 70 is connected to the gate of PFET 26. In the steady state, there will be no output from circuits 40 or 42 and resistor 68 will hold capacitor fully charged above the high set point of inverter 70. This holds the output of inverter 70 low which keeps transistor 26 turned on in the same manner that transistor 28 is normally on in the steady state.

When the positive edge detect circuits 40, 42 detect a positive edge, they briefly produce a negative going pulse which lowers the voltage at the input of inverter 70, briefly causing a change in state at the output of inverter 70 from low to high. This turns off transistor 26 for a period of time set by the RC time constant of resistor 68 and capacitor 66. The delay time of this circuit is also affected by the components in the positive edge detect circuits 40, 42 and by the frequency and duty cycle of the noise signals which transition the set points of receivers 14 and 16.

Referring to the positive edge detect circuit in FIG. 3, it will be understood that its operation is symmetrical to that of the negative edge detect circuit in FIG. 2. Input 72 is connected to capacitor 74 which is connected to the gate of NFET 76. The gate of transistor 76 is connected to ground through clamping diode 78 and resistor 80 in the same manner that the gate of transistor 60 in FIG. 2 is connected to the supply voltage through clamping diode 62 and resistor 64.

The present invention also includes the method of reducing the noise sensitivity of a receiver circuit while maintaining its rapid initial switching by connecting the plurality of individual receiver circuits to the circuit input, each receiver circuit having a different trip point ranging from a low trip point to a high trip point.

It will be understood that although the preferred embodiment employs three receiver circuits ranging from low to mid to high trip points, the number of receiver circuits may be reduced to only two, or additional receiver circuits may be implemented at varying trip points in the middle of the range. The receiver circuits operate to detect transitions of the digital input signal across the trip points of the receivers with associated edge detect circuitry.

Changes of state are delayed by the edge detect circuitry through the delay circuitry when transitions across the trip points of the individual receiver circuits occur as a result of noise in the input signal. In the preferred embodiment of the method, detecting transitions of the digital input signal across the trip points involves detecting falling transitions across the low trip point of low trip point receiver and rising transitions across the high trip point of the high trip point receiver.

Delaying changes of state at the circuit output involves delaying changes of state from low to high when falling transitions across the low trip point are detected and delaying changes of state from high to low when rising transitions across the high trip points are detected.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of reducing the noise sensitivity of a receiver circuit comprising:

provinding a circuit input for receiving a digital input signal;

providing a circuit output for outputting a digital output signal;

connecting a plurality of individual receiver circuits to the circuit input, each receiver circuit having a different trip point ranging from a low trip point to a high trip point;

detecting transitions of the digital input signal across the trip points of the plurality of individual receiver circuits with edge detect circuitry; and delaying changes of state at the circuit output when transitions across the trip points of the plurality of individual receiver circuits occur as the result of noise in the input signal.

2. A method of reducing the noise sensitivity of a receiver circuit according to claim 1 wherein the step of connecting a plurality of individual receiver circuits to the circuit input comprises connecting a high trip point receiver circuit and a low trip point receiver circuit to the circuit input.

3. A method of reducing the noise sensitivity of a receiver circuit according to claim 2 wherein the step of detecting transitions of the digital input signal across the trip points comprises detecting falling transitions across the low trip point and rising transitions across the high trip point, and the step of delaying changes of state at the circuit output includes delaying changes of state from low to high when falling transitions across the low trip point are detected and delaying changes of state from high to low when rising transitions across the high trip point are detected.

4. A noise detection and delay receiver circuit comprising:
   a circuit input for receiving a digital input signal;
   a circuit output for outputting a digital output signal;
   a high trip point receiver circuit connected to the circuit input, the high trip point receiver circuit providing a digital high to the circuit output for the digital output signal when the digital input signal has a voltage above a defined high trip point voltage;
   a low trip point receiver circuit connected to the circuit input, the low trip point receiver circuit providing a digital low to the circuit output for the digital output signal when the digital input signal has a voltage below a defined low trip point voltage;
   a negative edge detect circuit connected to the high trip point receiver circuit;
   a positive edge detect circuit connected to the low trip point receiver circuit; and
   a delay circuit connected to the positive and negative edge detect circuits and connected between the circuit output and the high and low trip point receiver circuits for delaying the digital output signal in the presence of noise in the digital input signal.

5. A noise detection and delay receiver circuit according to claim 4 further comprising:
   a mid trip point receiver circuit connected to the circuit input, the mid trip point receiver circuit having a trip point voltage between the high and low trip point voltages; and
   associated edge detect circuitry connected between the mid trip point receiver circuit and the delay circuit.

6. A noise detection and delay receiver circuit according to claim 5 wherein the associated edge detect circuitry connected between the mid trip point receiver circuit and the delay circuit comprises:
   a second positive edge detect circuit connected between the mid trip point receiver circuit and the delay circuit; and
   a second negative edge detect circuit connected between the mid trip point receiver circuit and the delay circuit.

7. A noise detection and delay receiver circuit according to claim 4 wherein the delay circuit comprises:
   a negative edge delay circuit connected to the negative edge detect circuit and connected between the circuit output and the high trip point receiver circuit; and
   a positive edge delay circuit connected to the positive edge detect circuit and connected between the circuit output and the low trip point receiver circuit.

8. A noise detection and delay receiver circuit according to claim 7 wherein the negative edge delay circuit includes a transistor connected between the receiver output and the low trip point receiver circuit, and a resistor and capacitor having an associated RC time constant, the RC time constant setting a delay period following detection of a negative edge by the negative edge detect circuit during which the transistor of the negative edge delay circuit prevents the low trip point receiver circuit from providing a digital low to the circuit output.

9. A noise detection and delay receiver circuit according to claim 7 wherein the positive edge delay circuit includes a transistor connected between the receiver output and the high trip point receiver circuit, and a resistor and capacitor having an associated RC time constant, the RC time constant setting a delay period following detection of a positive by the negative edge detect circuit during which the transistor of the positive edge delay circuit prevents the high trip point receiver circuit from providing a digital high to the circuit output.

10. A noise detection and delay receiver circuit according to claim 4 wherein the negative edge detect circuit comprises a capacitor connected between the high trip point receiver circuit and a control lead of a transistor, an element acting as a diode clamp connected to the control lead of the transistor and a resistor connected in parallel with the element acting as a diode clamp.

11. A noise detection and delay receiver circuit according to claim 4 wherein the positive edge detect circuit comprises a capacitor connected between the low trip point receiver circuit and a control lead of a transistor, an element acting as a diode clamp connected to the control lead of the transistor and a resistor connected in parallel with the element acting as a diode clamp.

12. A noise detection and delay receiver circuit according to claim 4 further including a soft latch connected to the circuit output.

13. A noise detection and delay receiver circuit according to claim 4 wherein:
   the circuit output is connected through first and second serially connected transistors to a supply voltage and through third and fourth serially connected transistors to ground;
   the high trip point receiver circuit is connected to a control lead of the first transistor, the high trip point receiver circuit turning on the first transistor to connect the circuit output to the supply voltage and produce a digital high at the circuit output when the second transistor is on;
   the low trip point receiver circuit is connected to a control lead of the fourth transistor, the low trip point receiver circuit turning on the fourth transistor to connect the circuit output to ground and produce a digital low at the circuit output when the third transistor is on; and
   the delay circuit includes the second and third transistors, the delay circuit turning off the second transistor to prevent the digital output signal from switching from low to high for a first delay time after detection of noise by the positive edge detect circuit and the delay circuit turning off the third transistor to prevent the digital output signal from switching from high to low for a second delay time after detection of noise by the negative edge detect circuit.

14. A noise detection and delay receiver circuit according to claim 13 wherein the first and second transistors are NFET's and the third and fourth transistors are PFET's.

15. A noise detection and delay receiver circuit comprising:
   a circuit input for receiving a digital input signal;
   a circuit output for outputting a digital output signal;
   a high trip point receiver circuit connected to the circuit input, the high trip point receiver circuit providing a digital high to the circuit output for the digital output signal when the digital input signal has a voltage above a defined high trip point voltage;
   a low trip point receiver circuit connected to the circuit input, the low trip point receiver circuit providing a digital low to the circuit output for the digital output signal when the digital-input signal has a voltage below a defined low trip point voltage;

a mid trip point receiver circuit connected to the circuit input;

a first negative edge detect circuit connected to the high trip point receiver circuit;

a second negative edge detect circuit connected to the mid trip point receiver circuit;

a first positive edge detect circuit connected to the low trip point receiver circuit;

a second positive edge detect circuit connected to the mid trip point receiver circuit;

a first transistor connected to a supply voltage and having a control lead connected to the high trip point receiver circuit;

a second transistor serially connected between the first transistor and the circuit output;

a third transistor serially connected between a fourth transistor and the circuit output;

the fourth transistor connected between the third transistor and ground, the fourth transistor having a control lead connected to the low trip point receiver circuit;

a delay circuit comprising:

a negative edge delay circuit responsively connected to the first and second negative edge detect circuits and including the third transistor, the third transistor being turned off by the negative edge delay circuit for a first delay time in the presence of noise detected by the negative edge detect circuits; and a positive edge delay circuit responsively connected to the first and second positive edge detect circuits and including the second transistor, the second transistor being turned off by the positive edge delay circuit for a second delay time in the presence of noise detected by the positive edge detect circuits.

\* \* \* \* \*